United States Patent
Camacho et al.

(10) Patent No.: US 7,714,419 B2
(45) Date of Patent: May 11, 2010

(54) INTEGRATED CIRCUIT PACKAGE SYSTEM WITH SHIELDING

(75) Inventors: Zigmund Ramirez Camacho, Singapore (SG); Lionel Chien Hui Tay, Singapore (SG); Henry Descalzo Bathan, Singapore (SG); Guruprasad Badakere Govindaiah, Singapore (SG)

(73) Assignee: Stats Chippac Ltd., Singapore (SG)

( * ) Notice: Subject to any disclaimer, the term of this patent is extended or adjusted under 35 U.S.C. 154(b) by 118 days.

(21) Appl. No.: 11/965,586

(22) Filed: Dec. 27, 2007

(65) Prior Publication Data

US 2009/0166822 A1 Jul. 2, 2009

(51) Int. Cl.
*H01L 23/495* (2006.01)

(52) U.S. Cl. .......... 257/670; 257/659; 257/666; 257/674; 257/676; 257/773; 257/E23.037; 257/E23.039; 257/E23.043

(58) Field of Classification Search ......... 257/666–669, 257/671–733, E23.031–E23.059, 659, 670; 438/111, 112, 123, FOR. 366, FOR. 367, 438/FOR. 377, FOR. 380
See application file for complete search history.

(56) References Cited

U.S. PATENT DOCUMENTS

| | | | |
|---|---|---|---|
| 6,951,776 B2 | 10/2005 | Lo et al. | |
| 7,025,848 B2 | 4/2006 | Wang | |
| 7,030,469 B2 | 4/2006 | Mahadevan et al. | |
| 7,045,890 B2 | 5/2006 | Xie et al. | |
| 7,051,311 B2 | 5/2006 | Tomita et al. | |
| 7,479,692 B2 * | 1/2009 | Dimaano et al. | 257/676 |
| 2004/0125568 A1 | 7/2004 | Tao | |
| 2005/0125568 A1 | 6/2005 | Yeo et al. | |
| 2006/0103009 A1 | 5/2006 | Lee et al. | |
| 2007/0045824 A1 | 3/2007 | Zhao et al. | |
| 2007/0063322 A1 | 3/2007 | Chow et al. | |
| 2007/0090502 A1 * | 4/2007 | Zhao et al. | 257/675 |
| 2007/0108598 A1 | 5/2007 | Zhong et al. | |
| 2007/0170554 A1 | 7/2007 | Camacho et al. | |
| 2007/0241431 A1 | 10/2007 | Manatad | |
| 2008/0001263 A1 | 1/2008 | Dimaano et al. | |

FOREIGN PATENT DOCUMENTS

JP        2-278752     * 11/1990    ............... 257/659

* cited by examiner

*Primary Examiner*—Jasmine J Clark
(74) *Attorney, Agent, or Firm*—Mikio Ishimaru

(57) ABSTRACT

An integrated circuit package system comprising: providing an elevated tiebar; forming a die paddle connected to the elevated tiebar; attaching an integrated circuit die over the die paddle adjacent the elevated tiebar; attaching a shield over the elevated tiebar and the integrated circuit die; and forming an encapsulant over a portion of the elevated tiebar, the die paddle, and the integrated circuit die.

17 Claims, 10 Drawing Sheets

INTEGRATED CIRCUIT PACKAGE SYSTEM WITH SHIELDING

CROSS-REFERENCE TO RELATED APPLICATION(S)

The present application contains subject matter related to a co-pending U.S. patent application Ser. No. 11/456,544 filed Jul. 10, 2006, which is assigned to STATS ChipPAC Ltd.

TECHNICAL FIELD

The present invention relates generally to integrated circuit packages and more particularly to a system for integrated circuit packages with shielding.

BACKGROUND ART

Users of electronic products continue to demand new features, speed, data, or reliability sometimes unwittingly. These demands have continually driven the electronics industry to reduce size, improve utility, or increase performance of the integrated circuits and integrated circuit packages contained within these electronic products. We have become very accustomed to and sometimes dependent on many modern conveniences that include electronic technology.

Electronic products have become an integral part of our daily lives. Notably, many portable electronics with integrated circuits are not only common but also often used without a user realizing that there is underlying electronic technology or the extent of the electronic technology. Many products such as cell phones, portable computers, voice recorders, cars, planes, etc. include very sophisticated technology that may or may not be obvious to an end user.

In order to interface an integrated circuit with other circuitry, it is common to mount it on a lead frame or substrate. Each integrated circuit has bonding pads that are individually connected to the lead frame's lead finger pads using extremely fine gold or aluminum wires. The assemblies are then packaged by individually encapsulating them in molded plastic or ceramic bodies to create an integrated circuit package.

In addition to the physical and electrical protection, many integrated circuit devices require protection from electromagnetic interference (EMI) as well. Integrated circuit devices and behave erratically or fail altogether if subjected to sufficient electromagnetic interference. Other integrated circuit devices or components can produce electromagnetic radiation as part of their typical operation so care must be taken to protect sensitive devices.

There is a significant demand for integrated circuit packages with EMI shielding. Attempts to shield packages such as quad flat no-lead (QFN) have struggled with process simplicity, robustness of package construction, and efficiency of EMI shielding including coverage area of the shield. There have been many limitations in shield footing, shield attach methods, and electrical grounding.

There continue to be issues with package shielding such as complex processing, poor package construction, or insufficient shielding. Complex processing often results in higher costs or decreased yield. Poor package construction can result in decreased yield or unreliable operation. Insufficient shielding can result in intermittent of partial failures due to poor device coverage or failures do to less than needed performance.

Despite the advantages of recent developments in integrated circuit and integrated circuit package manufacturing, there is a continuing need for improving integrated circuit package shielding to provide improved process simplicity, robust package construction, and efficiency of EMI shielding.

Thus, a need still remains for an integrated circuit package system to provide improved shielding. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an elevated tiebar; forming a die paddle connected to the elevated tiebar; attaching an integrated circuit die over the die paddle adjacent the elevated tiebar; attaching a shield over the elevated tiebar and the integrated circuit die; and forming an encapsulant over a portion of the elevated tiebar, the die paddle, and the integrated circuit die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
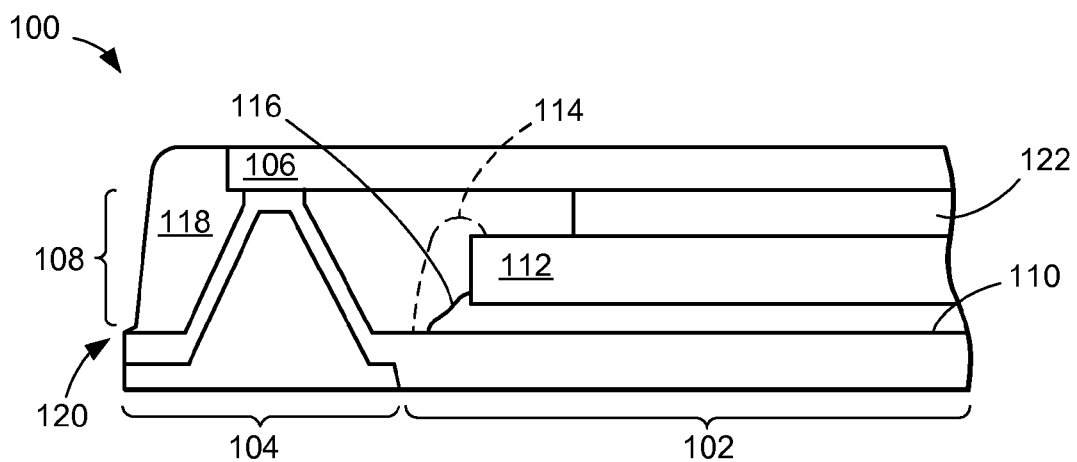
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
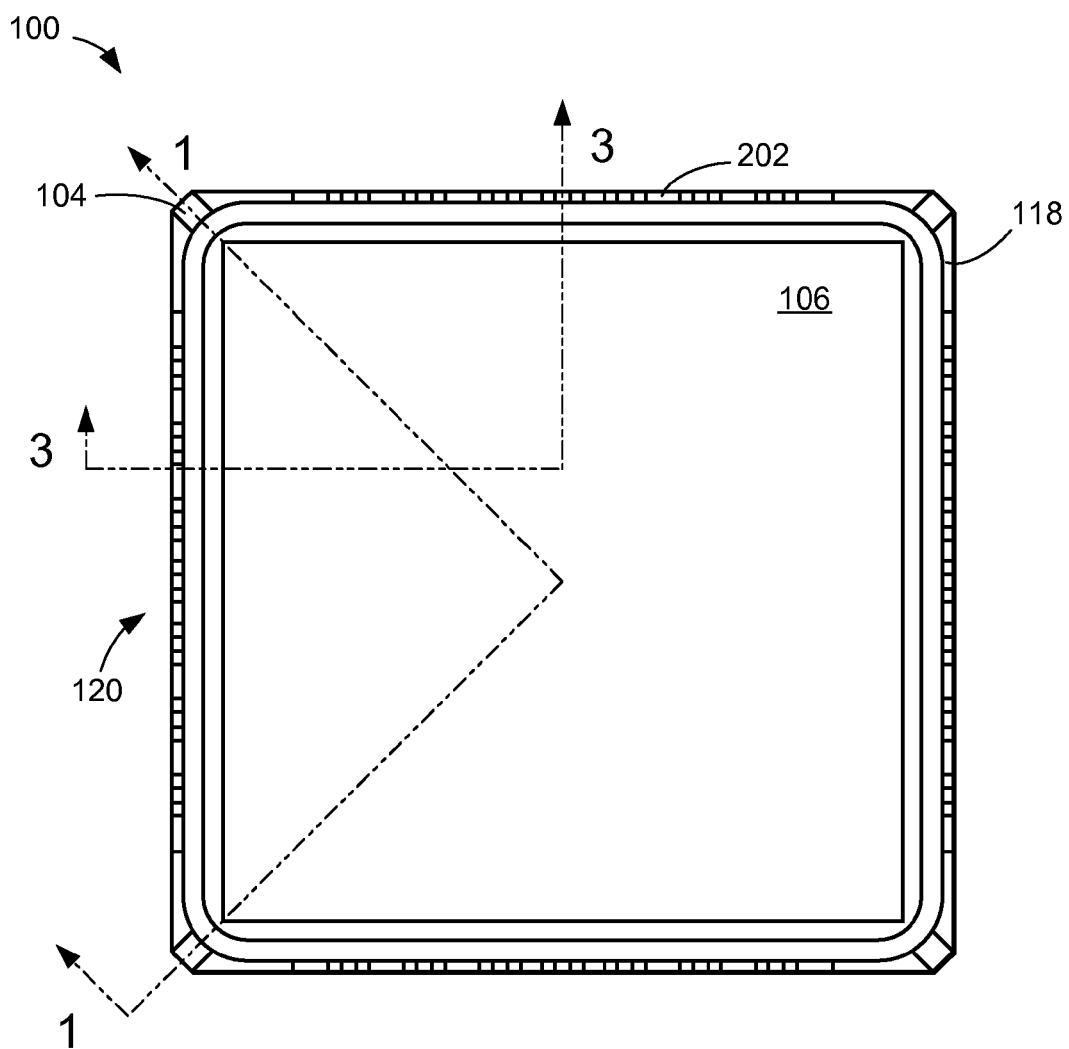
FIG. 2 is a top view of the integrated circuit package system.

Referring now to FIG. 1, therein is shown a cross-sectional view of an integrated circuit package system 100 taken along line 1-1 of FIG. 2 in a first embodiment of the present invention. The integrated circuit package system 100 preferably includes a die paddle 102 connected to an elevated tiebar 104. A shield 106 such as an electromagnetic interference shield can be mounted over the elevated tiebar 104.

An elevated portion 108 of the elevated tiebar 104 adjacent the die paddle 102 can be elevated or up set from a plane of a die paddle mount surface 110. The elevated portion 108 can be formed having predetermined dimensions to provide spacing for an integrated circuit die 112 and interconnects 114 (shown with hidden lines) such as bond wires or any conductive material. The interconnects 114 can provide electrical connectivity to the integrated circuit die 112 or the die paddle 102.

For example, the interconnects 114 to the die paddle 102 can be ground bonds connected to a ground pin of the integrated circuit die 112. The die paddle 102 can provide a ground reference wherein the elevated tiebar 104 connected to the die paddle 102 can also be grounded providing a grounding point for the shield 106. The interconnects 114 can also provide connectivity through the package to an external environment.

The shield 106 can be formed of any conductive material such as aluminized silicon, copper, aluminum, or combination thereof, for providing protection from interference such as electromagnetic interference (EMI). The shield 106 can be attached as an individual piece or in matrix form as an array having dimensions substantially the same as a lead frame array. Attaching the shield 106 can include adhesive, solder paste, an interference fit, or any other attachment process or technology.

The integrated circuit die 112 can be attached or mounted over the die paddle 102 with a die mount layer 116. The die mount layer 116 can provide spacing, adhesion, structural integrity, or a substantially fixed location for the integrated circuit die 112.

An encapsulant 118 can be applied over the integrated circuit die 112, the interconnects 114, and the die paddle 102. The encapsulant 118 can also be formed adjacent to and optionally over a portion of the shield 106. The encapsulant 118 can be a significant portion of a package side 120 formed with a process such as molding, singulation, or other processing. For example, the package side 120 can include a shape characteristic of punch singulation or saw singulation.

The package side 120 can be partially perpendicular to a top planar surface or a bottom planar surface of the integrated circuit package system 100. A length of the package side 120 is substantially the same as a length of the top planar surface or the bottom planar surface and a width or height of the package side 120 is substantially the same as a thickness, height, or z-dimension of the integrated circuit package system 100.

Optionally a shield mount layer 122 such as a spacer or attach layer can be formed over the integrated circuit die 112. The shield 106 can be attached or mounted over the shield mount layer 122. The shield mount layer 122 can be formed of a material such as a monolayer elastomer acrylic, any adhesive, a film, or combination thereof. Further, the shield mount layer 122 can optionally be a height limiter, an attach layer, or combination thereof.

For example, the shield mount layer 122 can provide a downward force for attachment of the shield 106. The elevated tiebar 104 can provide elasticity for contact of the shield 106. The downward force of the shield mount layer 122 and the elasticity of the elevated tiebar 104 can result in the shield 106 contacting the elevated tiebar 104 without the need for an adhesive, solder, or any conductive attachment material.

For illustrative purposes, the integrated circuit package system 100 is shown having the package side 120 formed as a map-type edge from punch singulation although it is understood that any other edge type may be formed such as a saw singulated edge. The saw singulated edge can include a vertical surface substantially perpendicular to the top planar surface or the bottom planar surface of the integrated circuit package system 100.

It has been discovered that the integrated circuit package system 100 with the elevated tiebar 104 and the shield 106 provides compatibility for attaching the shield 106 with various technologies including surface mount, force fit, drop-in-mold, or other mounting technologies resulting in improved package structure, less complicated manufacturing processes, or simpler bill of materials.

Referring now to FIG. 2 therein is shown a top view of the integrated circuit package system 100. The integrated circuit package system 100 preferably includes the shield 106 over the elevated tiebar 104 and adjacent the encapsulant 118. The integrated circuit package system 100 also includes package connectors 202 such as connectors for a quad flat no-lead package.

The encapsulant 118 can preferably provide a surface of the shield 106 substantially exposed and the package connectors 202 partially exposed. The package connectors 202 can optionally be partially exposed near the package side 120 in part a result of processing such as molding or singulation.

For illustrative purposes, the encapsulant 118 is shown having the characteristics of a punch singulation process although it is understood that any edge type or singulation process may be used such as providing the encapsulant 118 having the characteristics of a saw singulation process.

Figure 3:
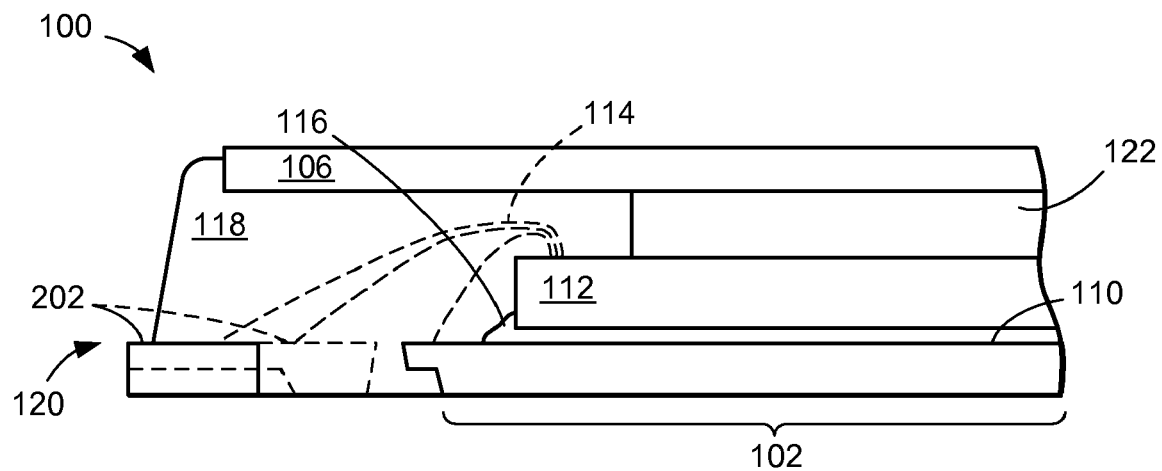
FIG. 3 is a cross sectional view of the integrated circuit package system taken along line 3-3 of FIG. 2.

Referring now to FIG. 3, therein is shown a cross sectional view of the integrated circuit package system 100 taken along line 3-3 of FIG. 2. The integrated circuit package system 100 preferably includes the integrated circuit die 112 attached or mounted over the die paddle mount surface 110 of the die paddle 102 with the die mount layer 116.

The shield 106 can be attached or mounted over the shield mount layer 122 covering the interconnects 114 wherein the interconnects 114 connecting the integrated circuit die 112, the die paddle 102, or the package connectors 202. The encapsulant 118 can cover and protect the integrated circuit die 112 and the interconnects 114 as well as form the package side 120 with a portion of the package connectors 202.

The package connectors 202 can optionally be formed in multiple rows such as outer leads or inner leads (shown with hidden lines). Multiple rows of the package connectors 202 can provide improved isolation, quantity, or routability for traces of a next level system such as another package or printed circuit board.

Figure 4:
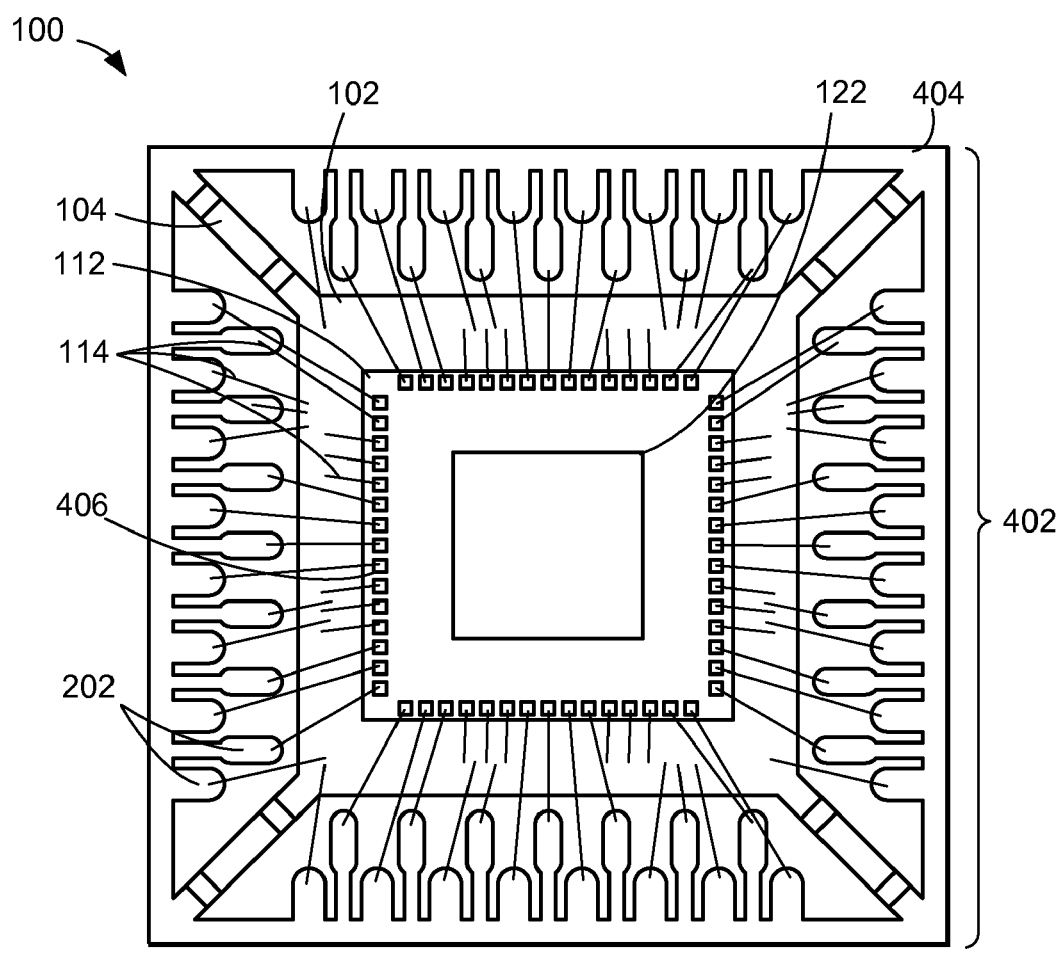
FIG. 4 is a top plan view of the integrated circuit package system in an interconnection phase.

Referring now to FIG. 4, therein is shown a top plan view of the integrated circuit package system 100 in an interconnection phase. The integrated circuit package system 100 preferably includes an elevated tiebar leadframe 402 having the die paddle 102, the elevated tiebar 104, and the package connectors 202.

The package connectors 202 can be connected to a lead bar 404 such as a tiebar or a dambar. The lead bar 404 can be removed in further processing to electrically separate or isolate each of the package connectors 202 one from another. Each of the package connectors 202 can provide conduction of electrical signals or electrical levels through the interconnects 114 to the die paddle 102 or bond pads 406 of the integrated circuit die 112.

For example, the interconnects 114 can preferably conduct electrical signals between the bond pads 406 of the integrated circuit die 112 and the package connectors 202 thereby providing connectivity to a next level system. Further for example, the interconnects 114 can conduct electrical levels such as power or ground between the package connectors 202, the die paddle 102, or the integrated circuit die 112.

Figure 5:
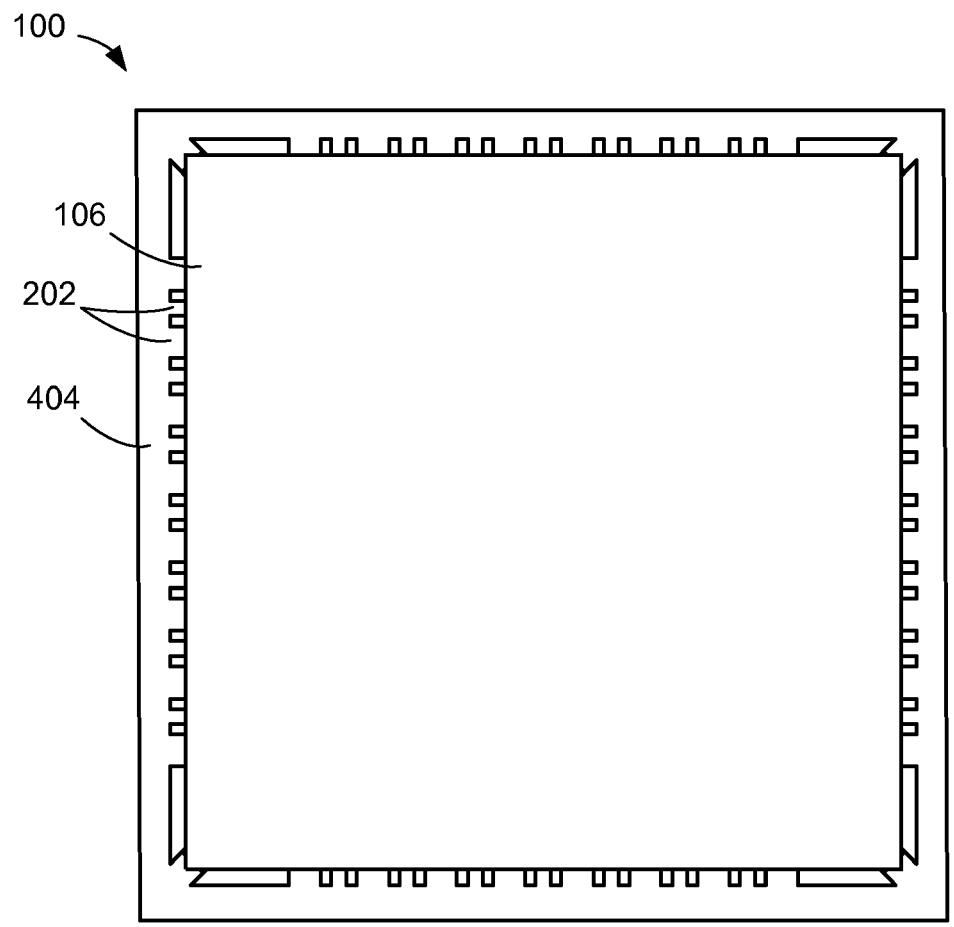
FIG. 5 is the structure of FIG. 4 in an attachment phase.

Referring now to FIG. 5, therein is shown the structure of FIG. 4 in an attachment phase. The integrated circuit package system 100 preferably includes the shield 106 attached over the structure of FIG. 4. The shield 106 covers and protects the integrated circuit die 112 of FIG. 1, the interconnects 114 of FIG. 1 from interference particularly interference of the electrical signals or electrical levels.

The shield 106 can be attached or mounted such as surface mount, force fit, drop-in-mold, or other mounting technologies over the elevated tiebar 104 of FIG. 1. The shield 106 can preferably provide the lead bar 404 substantially exposed for removal in further processing. Removal of the lead bar 404 can provide the package connectors 202 electrically separated or isolated for conduction of electrical signals or electrical levels.

Figure 6:
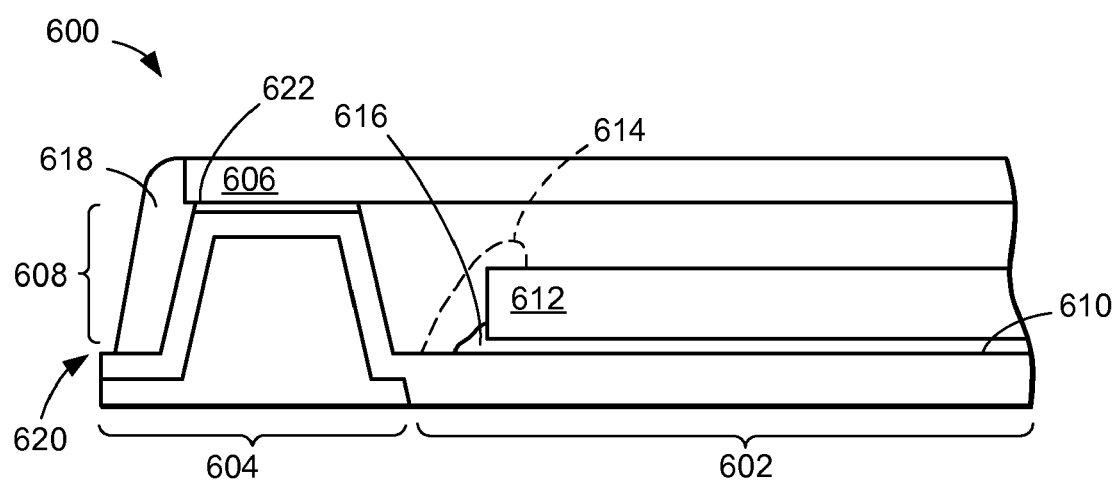
FIG. 6 is a cross sectional view of an integrated circuit package system in a second embodiment of the present invention.

Referring now to FIG. 6, therein is shown a cross sectional view of an integrated circuit package system 600 in a second embodiment of the present invention. Similar to the integrated circuit package system 100, the integrated circuit package system 600 preferably includes a die paddle 602 connected to an elevated tiebar 604. A shield 606 such as an electromagnetic interference shield can be mounted over the elevated tiebar 604.

An elevated portion 608 of the elevated tiebar 604 adjacent the die paddle 602 can be elevated or up set from a plane of a die paddle mount surface 610. The elevated portion 608 can be formed having predetermined dimensions to provide spacing for an integrated circuit die 612 and interconnects 614 (shown with hidden lines) such as bond wires or any conductive material. The interconnects 614 can provide electrical connectivity to the integrated circuit die 612 or the die paddle 602.

For example, the interconnects 614 to the die paddle 602 can be ground bonds connected to a ground pin of the integrated circuit die 612. The die paddle 602 can provide a ground reference wherein the elevated tie bar 604 connected to the die paddle 602 can also be grounded providing a grounding point for the shield 606. The interconnects 614 can also provide connectivity through the package to an external environment.

The integrated circuit die 612 can be attached or mounted over the die paddle 602 with a die mount layer 616. The die mount layer 616 can provide spacing, adhesion, structural integrity, or a substantially fixed location for the integrated circuit die 612.

An encapsulant 618 can be applied over the integrated circuit die 612, the interconnects 614, and the die paddle 602. The encapsulant 618 can also be formed adjacent to and optionally over a portion of the shield 606. The encapsulant 618 can be a significant portion of a package side 620 formed with a process such as molding, singulation, or other processing. For example, the package side 620 can include a shape characteristic of punch singulation or saw singulation.

Optionally a tiebar attach layer 622 can attach or mount the shield 606 without the need for the shield mount layer 122 of FIG. 1. The tiebar attach layer 622 such as solder paste, solder ball, or highly conductive epoxy adhesive paste can be formed over the elevated tiebar 604. The tiebar attach layer 622 can be applied with any embodiment of the present invention including embodiments having a spacer or attach layer such as the shield mount layer 122.

Figure 7:
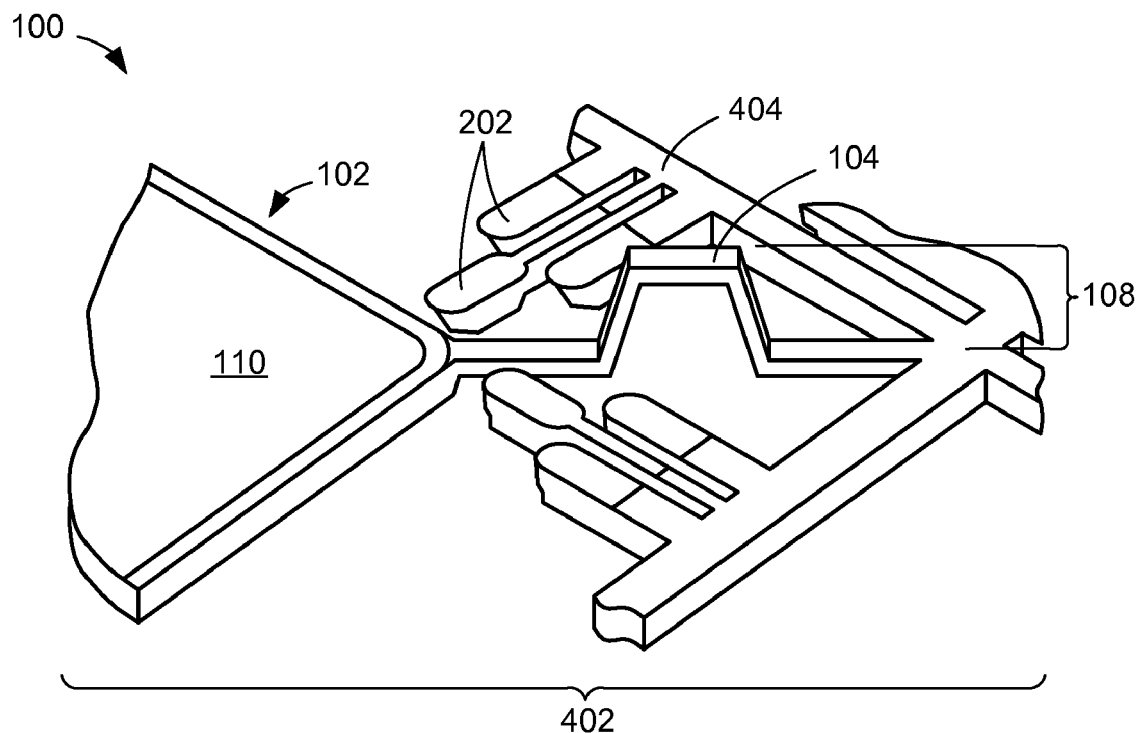
FIG. 7 is an isometric view of an enlarged portion of the integrated circuit package system in a lead frame formation phase.

Referring now to FIG. 7, therein is shown an isometric view of an enlarged portion of the integrated circuit package system 100 in a lead frame formation phase. The integrated circuit package system 100 can preferably include the elevated tiebar leadframe 402 having the die paddle 102, the elevated tiebar 104, and the package connectors 202 connected to the lead bar 404.

The elevated tiebar 104 can be connected to the die paddle 102 and the lead bar 404 with the package connectors 202 for processing such as die attach, wire bond, or encapsulation. The lead bar 404 provides structural integrity and substantially fixed positions for the package connectors 202 during processing wherein the lead bar 404 can be substantially removed during further processing such as post encapsulation isolation or singulation.

The elevated tiebar 104 can preferably be formed having the elevated portion 108 elevated or up set from a plane of the die paddle mount surface 110. The elevated portion 108 can include predetermined dimensions with a spacing for the integrated circuit die 112 of FIG. 1 and the interconnects 114 of FIG. 1.

Figure 8:
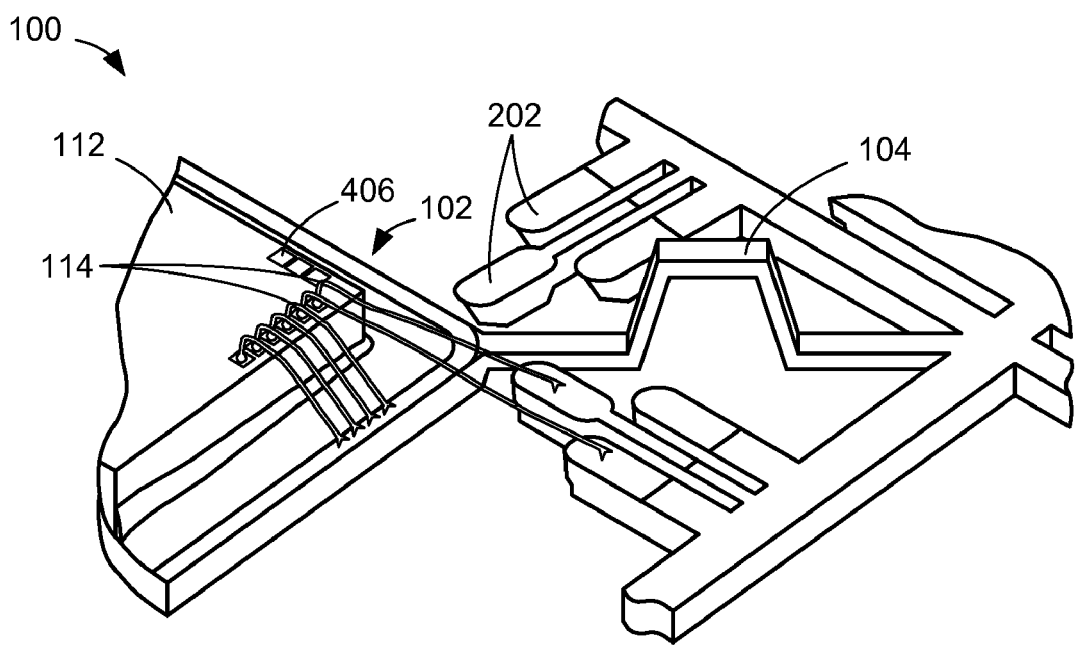
FIG. 8 is an isometric view of an enlarged portion of the integrated circuit package system in a lead frame connection phase.

Referring now to FIG. 8, therein is shown an isometric view of an enlarged portion of the integrated circuit package system 100 in a lead frame connection phase. The integrated circuit package system 100 can preferably include the elevated tiebar 104, the package connectors 202, and the integrated circuit die 112 over the die paddle 102.

The interconnects 114 can connect the bond pads 406 of the integrated circuit die 112 and the die paddle 102 for electrical connectivity such as electrical levels including ground. The interconnects 114 can also connect the bond pads 406 and the package connectors 202 for electrical connectivity such as electrical signals.

Figure 9:
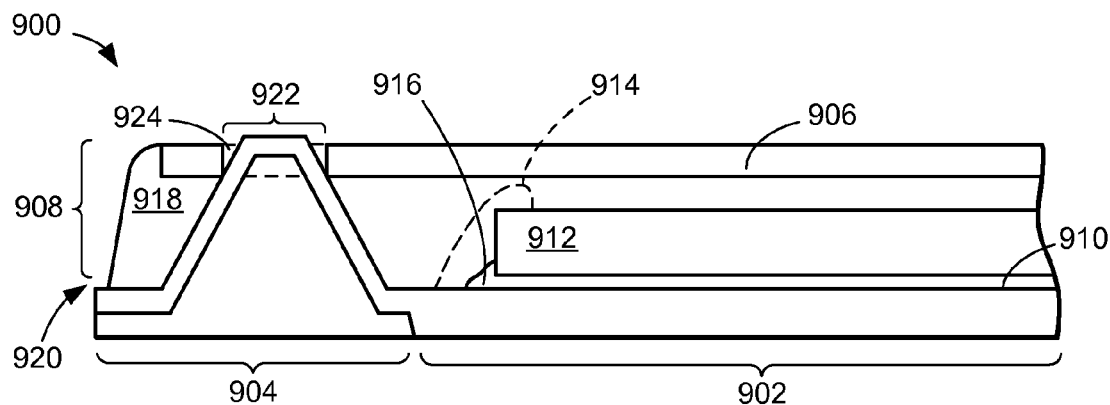
FIG. 9 is a cross-sectional view of an integrated circuit package system taken along line 9-9 of FIG. 10 in a third embodiment of the present invention.
Figure 10:
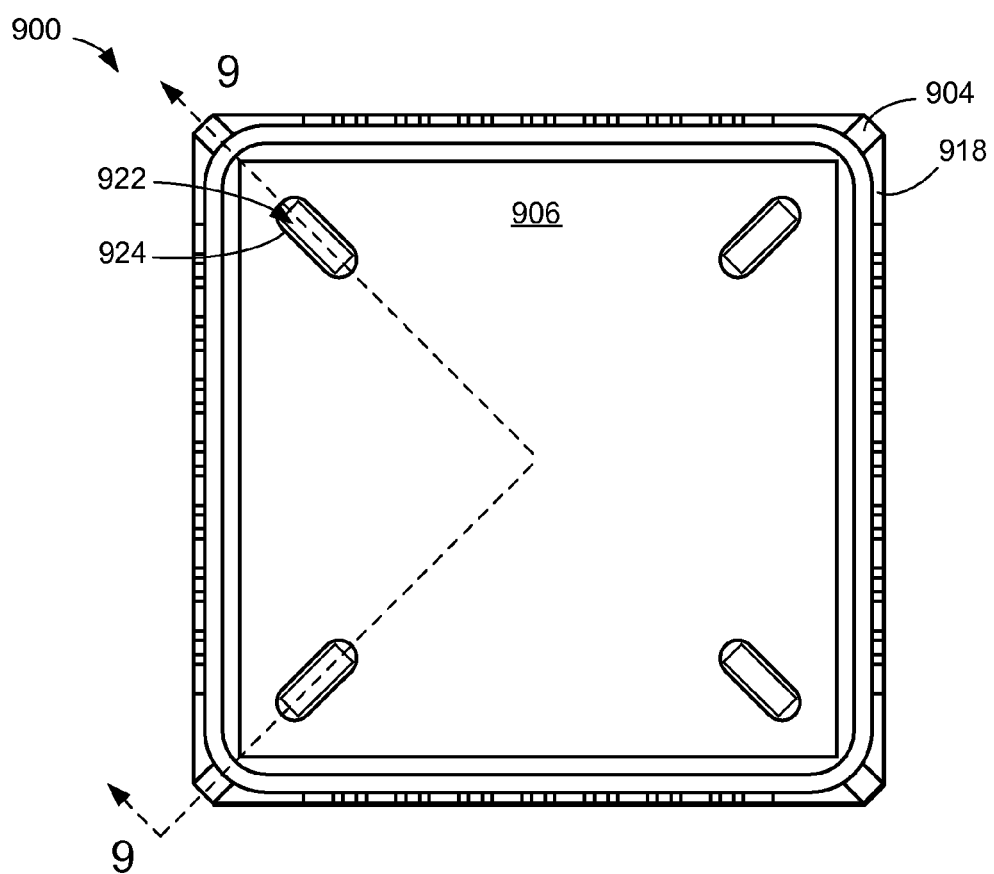
FIG. 10 is a top plan view of the integrated circuit package system.

Referring now to FIG. 9, therein is shown a cross-sectional view of an integrated circuit package system 900 taken along line 9-9 of FIG. 10 in a third embodiment of the present invention. The integrated circuit package system 900 preferably includes a die paddle 902 connected to an elevated tiebar 904. A shield 906 such as an electromagnetic interference shield can be mounted over the elevated tiebar 904.

An elevated portion 908 of the elevated tiebar 904 adjacent the die paddle 902 can be elevated or up set from a plane of a die paddle mount surface 910. The elevated portion 908 can be formed having predetermined dimensions to provide spacing for an integrated circuit die 912 and interconnects 914 (shown with hidden lines) such as bond wires or any conductive material. The interconnects 914 can provide electrical connectivity to the integrated circuit die 912 or the die paddle 902.

For example, the interconnects 914 to the die paddle 902 can be ground bonds connected to a ground pin of the integrated circuit die 912. The die paddle 902 can provide a ground reference wherein the elevated tiebar 904 connected to the die paddle 902 can also be grounded providing a grounding point for the shield 906. The interconnects 914 can also provide connectivity through the package to an external environment.

The integrated circuit die 912 can be attached or mounted over the die paddle 902 with a die mount layer 916. The die mount layer 916 can provide spacing, adhesion, structural integrity, or a substantially fixed location for the integrated circuit die 912. As an option, a shield attach spacer adhesive (not shown) similar to the shield mount layer 122 can be applied to improve attachment and fixation of the shield 906 for further processing such as encapsulation.

An encapsulant 918 can be applied over the integrated circuit die 912, the interconnects 914, and the die paddle 902. The encapsulant 918 can also be formed adjacent to and optionally over a portion of the shield 906. The encapsulant 918 can be a significant portion of a package side 920 formed with a process such as molding, singulation, or other processing. For example, the package side 920 can include a shape characteristic of punch singulation or saw singulation.

The shield 906 can optionally include shield openings 922 formed in locations predetermined to have the same locations as the elevated portion 908 of the elevated tiebar 904 with the shield 906 placed over the elevated tiebar 904. For example, the elevated portion 908 can be partially inserted into each of the shield openings 922 wherein a top surface of the elevated portion 908 can be substantially coplanar to a plane of the top surface of the shield 906.

Optionally a tiebar attach material 924 can attach or mount the shield 906. The tiebar attach material 924 such as solder paste, solder ball, or highly conductive epoxy adhesive paste can be formed over the elevated tiebar 904. The tiebar attach material 924 can be applied with any embodiment of the present invention including embodiments having a spacer or attach layer such as the shield mount layer 122 of FIG. 1 wherein the shield 906 can be electrically connected to the elevated tiebar 904 for grounding of the shield 906 to provide electromagnetic interference shielding.

Referring now to FIG. 10, therein is shown a top plan view of the integrated circuit package system 900. The integrated circuit package system 900 preferably includes the shield 906 placed over the elevated tiebar 904, the integrated circuit die 912 of FIG. 9, and the interconnects 914 of FIG. 9.

The shield openings 922 with the tiebar attach material 924 can be attached or mounted over the elevated tiebar 904 wherein the elevated tiebar 904 are partially in the shield openings 922. The encapsulant 918 can also be formed partially over the elevated tiebar 904, the integrated circuit die 912, the interconnects 914, and adjacent the shield 906.

For illustrative purposes, the integrated circuit package system 900 is shown have four of the shield openings 922 although it is understood that any number of the shield openings 922 can be used.

Figure 11:
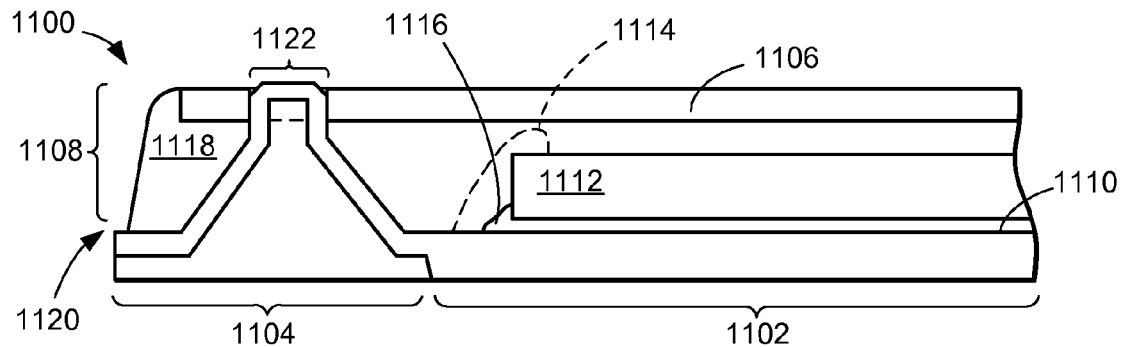
FIG. 11 is a cross-sectional view of an integrated circuit package system taken along line 11-11 of FIG. 12 in a fourth embodiment of the present invention.
Figure 12:
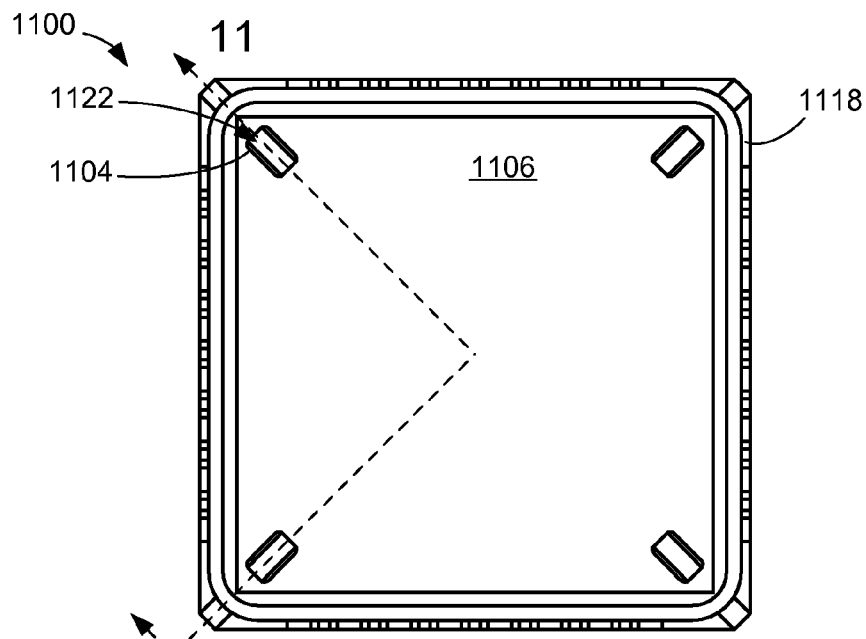
FIG. 12 is a top plan view of the integrated circuit package system.

Referring now to FIG. 11, therein is shown a cross-sectional view of an integrated circuit package system 1100 taken along line 11-11 of FIG. 12 in a fourth embodiment of the present invention. The integrated circuit package system 1100 preferably includes a die paddle 1102 connected to an elevated tiebar 1104. A shield 1106 such as an electromagnetic interference shield can be mounted over the elevated tiebar 1104.

An elevated portion 1108 of the elevated tiebar 1104 adjacent the die paddle 1102 can be elevated or up set from a plane of a die paddle mount surface 1110. The elevated portion 1108 can be formed having predetermined dimensions to provide spacing for an integrated circuit die 1112 and interconnects 1114 (shown with hidden lines) such as bond wires or any conductive material. The interconnects 1114 can provide electrical connectivity to the integrated circuit die 1112 or the die paddle 1102.

For example, the interconnects 1114 to the die paddle 1102 can be ground bonds connected to a ground pin of the integrated circuit die 1112. The die paddle 1102 can provide a ground reference wherein the elevated tiebar 1104 connected to the die paddle 1102 can also be grounded providing a grounding point for the shield 1106. The interconnects 1114 can also provide connectivity through the package to an external environment.

The integrated circuit die 1112 can be attached or mounted over the die paddle 1102 with a die mount layer 1116. The die mount layer 1116 can provide spacing, adhesion, structural integrity, or a substantially fixed location for the integrated circuit die 1112.

An encapsulant 1118 can be applied over the integrated circuit die 1112, the interconnects 1114, and the die paddle

1102. The encapsulant 1118 can also be formed adjacent to and optionally over a portion of the shield 1106. The encapsulant 1118 can be a significant portion of a package side 1120 formed with a process such as molding, singulation, or other processing. For example, the package side 1120 can include a shape characteristic of punch singulation or saw singulation.

The shield 1106 can optionally include shield openings 1122 formed in locations predetermined to have the same locations as the elevated portion 1108 of the elevated tiebar 1104 with the shield 1106 placed over the elevated tiebar 1104. The elevated portion 1108 can be attached with an interference fit such as a force fit wherein friction and pressure provide electrical connectivity, structural integrity, or a substantially fixed position for the shield 1106.

For example, each the elevated portion 1108 can be partially inserted into each of the shield openings 1122 wherein a top surface of the elevated portion 1108 can be substantially coplanar to a plane of the top surface of the shield 1106. The interference fit with the elevated tiebar 1104 and the shield openings 1122 can be applied with any embodiment of the present invention including embodiments having a spacer or attach layer such as the shield mount layer 122 of FIG. 1.

Referring now to FIG. 12, therein is shown a top plan view of the integrated circuit package system 1100. The integrated circuit package system 1100 preferably includes the shield 1106 placed over the elevated tiebar 1104, the integrated circuit die 1112 of FIG. 11, and the interconnects 1114 of FIG. 11.

The shield openings 1122 can be attached or mounted over the elevated tiebar 1104 with an interference fit wherein the elevated tiebar 1104 are partially in the shield openings 1122. The encapsulant 1118 can also be formed partially over the elevated tiebar, the integrated circuit die 1112, the interconnects 1114, and adjacent the shield 1106.

For illustrative purposes, the integrated circuit package system 1100 is shown have four of the shield openings 1122 although it is understood that any number of the shield openings 1122 can be used.

Figure 13:
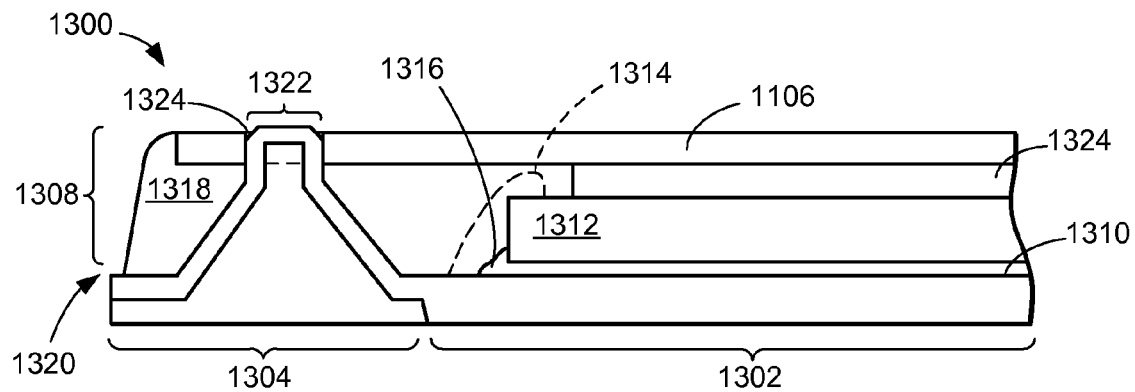
FIG. 13 is a cross-sectional view of an integrated circuit package system in a fifth embodiment of the present invention.

Referring now to FIG. 13, therein is shown a cross-sectional view of an integrated circuit package system 1300 in a fifth embodiment of the present invention. Similar to the integrated circuit package system 1100, the integrated circuit package system 1300 preferably includes a die paddle 1302 connected to an elevated tiebar 1304. A shield 1306 such as an electromagnetic interference shield can be mounted over the elevated tiebar 1304.

An elevated portion 1308 of the elevated tiebar 1304 adjacent the die paddle 1302 can be elevated or up set from a plane of a die paddle mount surface 1310. The elevated portion 1308 can be formed having predetermined dimensions to provide spacing for an integrated circuit die 1312 and interconnects 1314 (shown with hidden lines) such as bond wires or any conductive material. The interconnects 1314 can provide electrical connectivity to the integrated circuit die 1312 or the die paddle 1302.

For example, the interconnects 1314 to the die paddle 1302 can be ground bonds connected to a ground pin of the integrated circuit die 1312. The die paddle 1302 can provide a ground reference wherein the elevated tiebar 1304 connected to the die paddle 1302 can also be grounded providing a grounding point for the shield 1306. The interconnects 1314 can also provide connectivity through the package to an external environment.

The integrated circuit die 1312 can be attached or mounted over the die paddle 1302 with a die mount layer 1316. The die mount layer 1316 can provide spacing, adhesion, structural integrity, or a substantially fixed location for the integrated circuit die 1312.

An encapsulant 1318 can be applied over the integrated circuit die 1312, the interconnects 1314, and the die paddle 1302. The encapsulant 1318 can also be formed adjacent to and optionally over a portion of the shield 1306. The encapsulant 1318 can be a significant portion of a package side 1320 formed with a process such as molding, singulation, or other processing. For example, the package side 1320 can include a shape characteristic of punch singulation or saw singulation.

The shield 1306 can optionally include shield openings 1322 formed in locations predetermined to have the same locations as the elevated portion 1308 of the elevated tiebar 1304 with the shield 1306 placed over the elevated tiebar 1304. The elevated portion 1308 can be attached with an interference fit such as a force fit wherein friction and pressure provide electrical connectivity, structural integrity, or a substantially fixed position for the shield 1306.

Optionally, a shield mount layer 1324 such as a spacer or attach layer can be formed over the integrated circuit die 1312. The shield 1306 can be attached or mounted over the shield mount layer 1324. The shield mount layer 1324 can be formed of a material such as a monolayer elastomer acrylic, any adhesive, a film, or combination thereof. Further, the shield mount layer 1324 can optionally be a height limiter, an attach layer, or combination thereof.

For example, the shield mount layer 1324 can provide a downward force for attachment of the shield 1306. The elevated tiebar 1304 can provide elasticity for contact of the shield 1306. The downward force of the shield mount layer 1324 and the elasticity of the elevated tiebar 1304 can result in the shield 1306 contacting the elevated tiebar 1304 without the need for an adhesive, solder, or any conductive attachment material.

Figure 14:
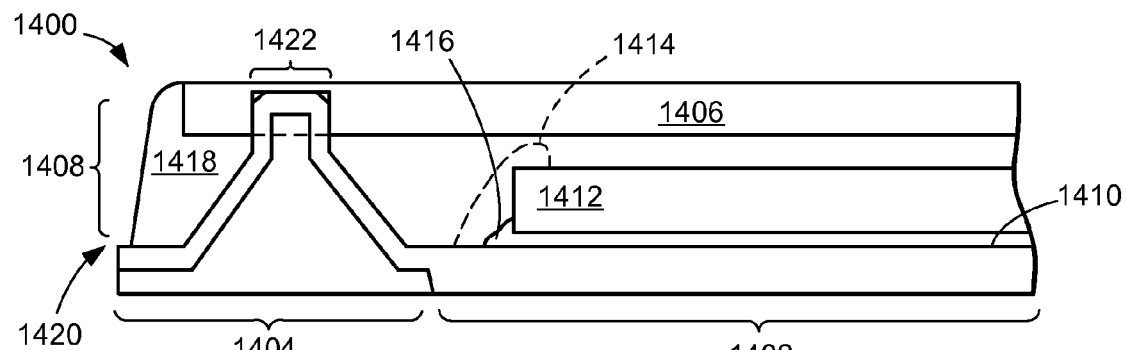
FIG. 14 is a cross-sectional view of an integrated circuit package system taken along line 14-14 of FIG. 15 in a sixth embodiment of the present invention.
Figure 15:
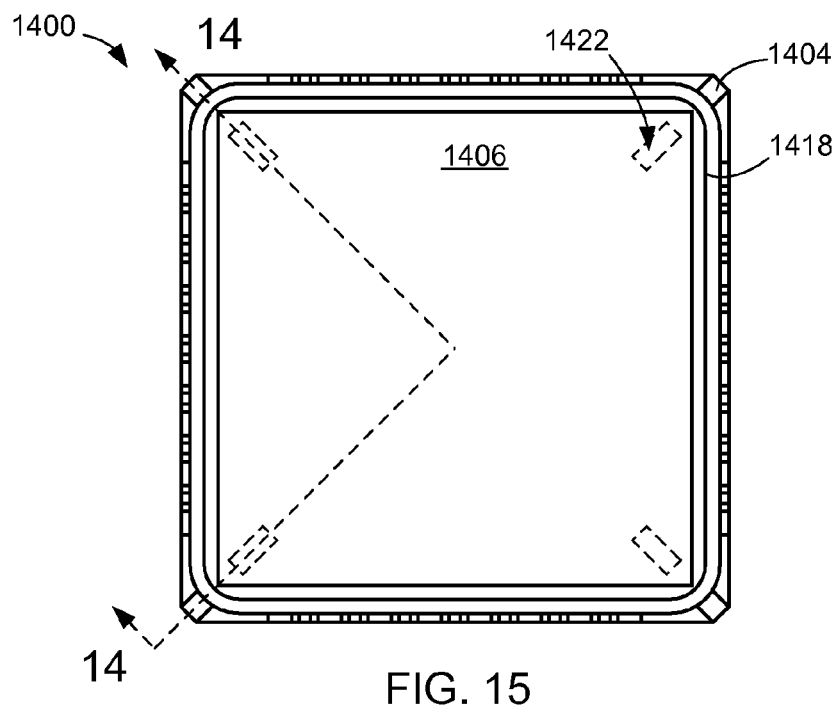
FIG. 15 is a top plan view of the integrated circuit package system.

Referring now to FIG. 14, therein is shown a cross-sectional view of an integrated circuit package system 1400 taken along line 14-14 of FIG. 15 in a sixth embodiment of the present invention. The integrated circuit package system 1400 preferably includes a die paddle 1402 connected to an elevated tiebar 1404. A shield 1406 such as an electromagnetic interference shield can be mounted over the elevated tiebar 1404.

An elevated portion 1408 of the elevated tiebar 1404 adjacent the die paddle 1402 can be elevated or up set from a plane of a die paddle mount surface 1410. The elevated portion 1408 can be formed having predetermined dimensions to provide spacing for an integrated circuit die 1412 and interconnects 1414 (shown with hidden lines) such as bond wires or any conductive material. The interconnects 1414 can provide electrical connectivity to the integrated circuit die 1412 or the die paddle 1402.

For example, the interconnects 1414 to the die paddle 1402 can be ground bonds connected to a ground pin of the integrated circuit die 1412. The die paddle 1402 can provide a ground reference wherein the elevated tiebar 1404 connected to the die paddle 1402 can also be grounded providing a grounding point for the shield 1406. The interconnects 1414 can also provide connectivity through the package to an external environment.

The integrated circuit die 1412 can be attached or mounted over the die paddle 1402 with a die mount layer 1416. The die mount layer 1416 can provide spacing, adhesion, structural integrity, or a substantially fixed location for the integrated circuit die 1412.

An encapsulant 1418 can be applied over the integrated circuit die 1412, the interconnects 1414, and the die paddle 1402. The encapsulant 1418 can also be formed adjacent to and optionally over a portion of the shield 1406. The encapsulant 1418 can be a significant portion of a package side 1420 formed with a process such as molding, singulation, or other processing. For example, the package side 1420 can include a shape characteristic of punch singulation or saw singulation.

The shield 1406 can optionally include a shield cavity 1422 formed in locations predetermined to have the same locations as the elevated portion 1408 of the elevated tiebar 1404 with the shield 1406 placed over the elevated tiebar 1404. The elevated portion 1408 can be attached with an interference fit such as a force fit wherein friction and pressure provide electrical connectivity, structural integrity, or a substantially fixed position for the shield 1406.

For example, each the elevated portion 1408 can be partially inserted into each of the shield cavity 1422 wherein a top region of the elevated portion 1408 can be in the shield cavity 1422 near a closed end of the shield cavity 1422. The interference fit with the elevated tiebar 1404 and the shield cavity 1422 can be applied with any embodiment of the present invention including embodiments having a spacer or attach layer such as the shield mount layer 122 of FIG. 1.

Referring now to FIG. 15, therein is shown a top plan view of the integrated circuit package system 1400. The integrated circuit package system 1400 preferably includes the shield 1406 placed over the elevated tiebar 1404, the integrated circuit die 1412 of FIG. 14, and the interconnects 1414 of FIG. 14.

The shield cavity 1422 (shown with hidden lines) can be attached or mounted over the elevated tiebar 1404 with an interference fit wherein the elevated tiebar 1404 are partially in the shield cavity 1422 near a closed end of the shield cavity 1422. The encapsulant 1418 can also be formed partially over the elevated tiebar, the integrated circuit die 1412, the interconnects 1414, and adjacent the shield 1406.

For illustrative purposes, the integrated circuit package system 1400 is shown have four of the shield cavity 1422 although it is understood that any number of the shield cavity 1422 can be used.

Figure 16:
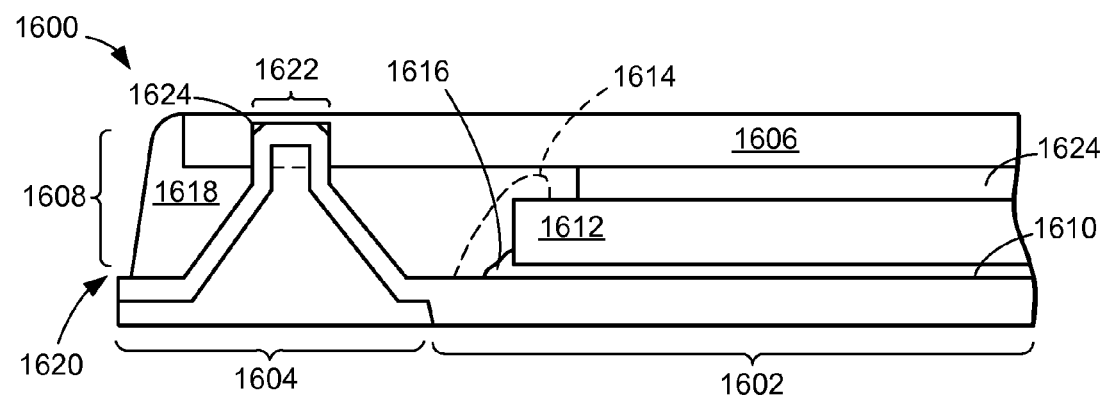
FIG. 16 is a cross-sectional view of an integrated circuit package system in a seventh embodiment of the present invention.

Referring now to FIG. 16, therein is shown a cross-sectional view of an integrated circuit package system 1600 in a seventh embodiment of the present invention. Similar to the integrated circuit package system 100, the integrated circuit package system 1600 preferably includes a die paddle 1602 connected to an elevated tiebar 1604. A shield 1606 such as an electromagnetic interference shield can be mounted over the elevated tiebar 1604.

An elevated portion 1608 of the elevated tiebar 1604 adjacent the die paddle 1602 can be elevated or up set from a plane of a die paddle mount surface 1610. The elevated portion 1608 can be formed having predetermined dimensions to provide spacing for an integrated circuit die 1612 and interconnects 1614 (shown with hidden lines) such as bond wires or any conductive material. The interconnects 1614 can provide electrical connectivity to the integrated circuit die 1612 or the die paddle 1602.

For example, the interconnects 1614 to the die paddle 1602 can be ground bonds connected to a ground pin of the integrated circuit die 1612. The die paddle 1602 can provide a ground reference wherein the elevated tiebar 1604 connected to the die paddle 1602 can also be grounded providing a grounding point for the shield 1606. The interconnects 1614 can also provide connectivity through the package to an external environment.

The integrated circuit die 1612 can be attached or mounted over the die paddle 1602 with a die mount layer 1616. The die mount layer 1616 can provide spacing, adhesion, structural integrity, or a substantially fixed location for the integrated circuit die 1612.

An encapsulant 1618 can be applied over the integrated circuit die 1612, the interconnects 1614, and the die paddle 1602. The encapsulant 1618 can also be formed adjacent to and optionally over a portion of the shield 1606. The encapsulant 1618 can be a significant portion of a package side 1620 formed with a process such as molding, singulation, or other processing. For example, the package side 1620 can include a shape characteristic of punch singulation or saw singulation.

The shield 1606 can optionally include a shield cavity 1622 formed in locations predetermined to have the same locations as the elevated portion 1608 of the elevated tiebar 1604 with the shield 1606 placed over the elevated tiebar 1604. The elevated portion 1608 can be attached near a closed end of the shield cavity 1622 with an interference fit such as a force fit wherein friction and pressure provide electrical connectivity, structural integrity, or a substantially fixed position for the shield 1606.

Optionally, a shield mount layer 1624 such as a spacer or attach layer can be formed over the integrated circuit die 1612. The shield 1606 can be attached or mounted over the shield mount layer 1624. The shield mount layer 1624 can be formed of a material such as a monolayer elastomer acrylic, any adhesive, a film, or combination thereof. Further, the shield mount layer 1624 can optionally be a height limiter, an attach layer, or combination thereof.

For example, the shield mount layer 1624 can provide a downward force for attachment of the shield 1606. The elevated tiebar 1604 can provide elasticity for contact of the shield 1606. The downward force of the shield mount layer 1624 and the elasticity of the elevated tiebar 1604 can result in the shield 1606 contacting the elevated tiebar 1604 without the need for an adhesive, solder, or any conductive attachment material.

Figure 17:
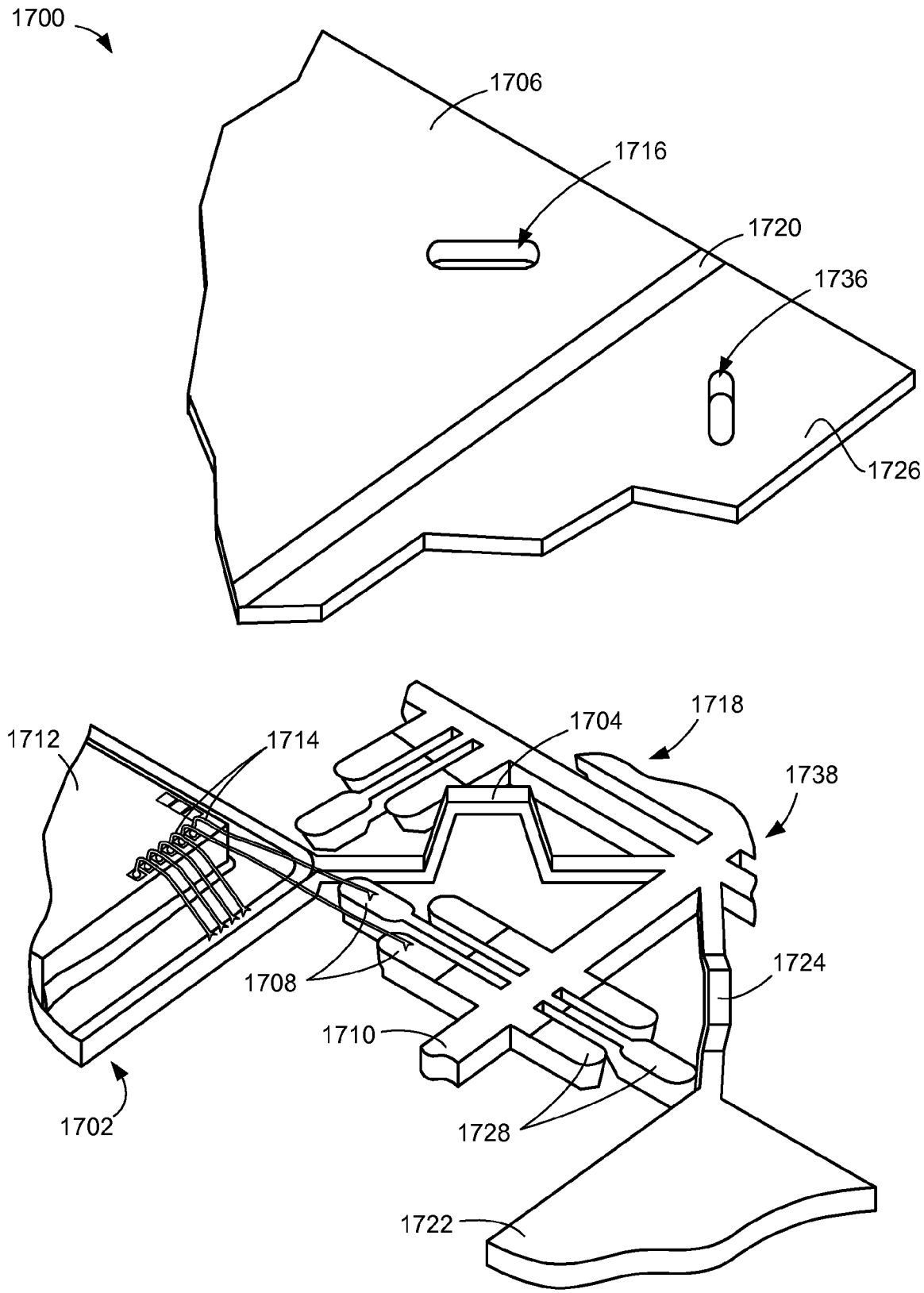
FIG. 17 is an isometric view of an integrated circuit package system in an attachment phase of an eighth embodiment of the present invention.

Referring now to FIG. 17, therein is shown an isometric view of an integrated circuit package system 1700 in an attachment phase of an eighth embodiment of the present invention. The integrated circuit package system 1700 preferably includes a first die paddle 1702 attached to a first elevated tiebar 1704, a first cut-compatible shield 1706, first package connectors 1708 connected to lead bars 1710 for processing, and a first integrated circuit die 1712 electrically connected with first interconnects 1714. The first die paddle 1702, the first elevated tiebar 1704, and the first package connectors 1708 can form a first elevated tiebar leadframe 1718.

A cut line 1720 such as a saw path can be formed adjacent the first cut-compatible shield 1706. A portion of the cut line 1720 can be removed to separate or isolate the first cut-compatible shield 1706 before or after attaching the first cut-compatible shield 1706. The first cut-compatible shield 1706 can be attached with a portion of the first elevated tiebar 1704 partially in a first shield opening 1716.

The integrated circuit package system 1700 can also include a second die paddle 1722 attached to a second elevated tiebar 1724, a second cut-compatible shield 1726, second package connectors 1728 connected to the lead bars 1710 for processing, and a first integrated circuit die 1732. The second die paddle 1722, the second elevated tiebar 1724, and the second package connectors 1728 can form a second elevated tiebar leadframe 1738.

A portion of the cut line 1720 can be removed to separate or isolate the second cut-compatible shield 1726 from the first cut-compatible shield 1706 before or after attaching the second cut-compatible shield 1726. The second cut-compatible shield 1726 can be attached with a portion of the second elevated tiebar 1724 partially in a second shield opening 1736.

For illustrative purposes, one of the first cut-compatible shield 1706 and one of the second cut-compatible shield 1726 are shown although it is understood that any number including zero of the first cut-compatible shield 1706 or the second cut-compatible shield 1726 may be used.

Similarly for illustrative purposes, one of the first elevated tiebar leadframe 1718 and one of the second elevated tiebar leadframe 1738 are shown although it is understood that any number including zero of the first elevated tiebar leadframe 1718 and the second elevated tiebar leadframe 1738 may be used.

Figure 18:
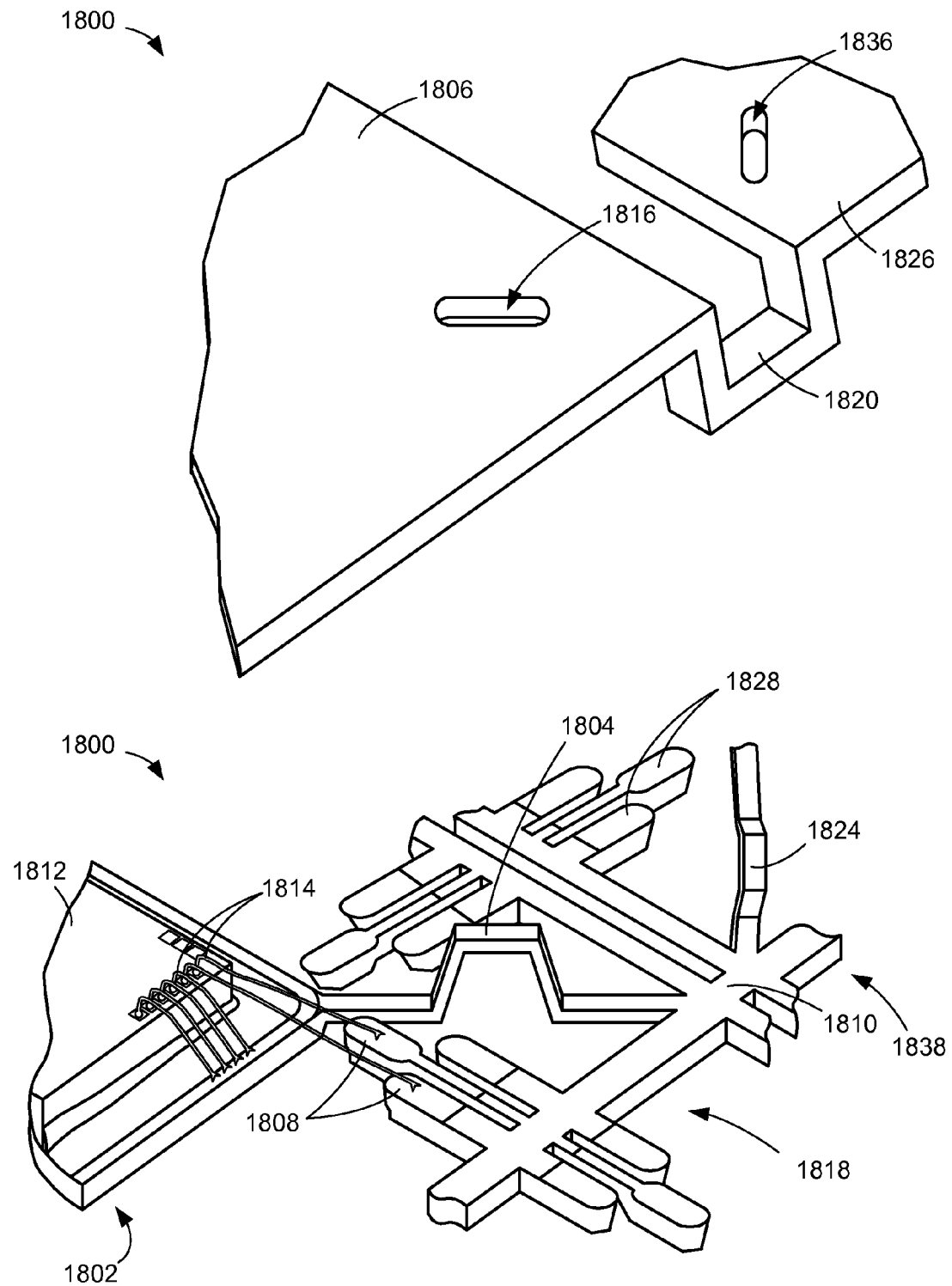
FIG. 18 is an isometric view of an integrated circuit package system in an attachment phase of a ninth embodiment of the present invention.

Referring now to FIG. 18, therein is shown an isometric view of an integrated circuit package system 1800 in an attachment phase of a ninth embodiment of the present invention. Similar to the integrated circuit package system 100, the integrated circuit package system 1800 preferably includes a first die paddle 1802 attached to a first elevated tiebar 1804, a first punch-compatible shield 1806, first package connectors 1808 connected to lead bars 1810 for processing, and a first integrated circuit die 1812 electrically connected with first interconnects 1814. The first die paddle 1802, the first elevated tiebar 1804, and the first package connectors 1808 can form a first elevated tiebar leadframe 1818.

A shield connector bar 1820 such as a shield tiebar can be formed adjacent the first punch-compatible shield 1806. A portion of the shield connector bar 1820 can be removed to separate or isolate the first punch-compatible shield 1806 before or after attaching the first punch-compatible shield 1806. The first punch-compatible shield 1806 can be attached with a portion of the first elevated tiebar 1804 partially in a first shield opening 1816.

The integrated circuit package system 1800 can also include a second elevated tiebar 1824, a second punch-compatible shield 1826, second package connectors 1828 connected to the lead bars 1810 for processing, and a first integrated circuit die 1832. The second elevated tiebar 1824 as well as the second package connectors 1828 can form a second elevated tiebar leadframe 1838.

A portion of the shield connector bar 1820 can be removed to separate or isolate the second punch-compatible shield 1826 from the first punch-compatible shield 1806 before or after attaching the second punch-compatible shield 1826. The second punch-compatible shield 1826 can be attached with a portion of the second elevated tiebar 1824 partially in a second shield opening 1836.

For illustrative purposes, one of the first punch-compatible shield 1806 and one of the second punch-compatible shield 1826 are shown although it is understood that any number including zero of the first punch-compatible shield 1806 or the second punch-compatible shield 1826 may be used.

Similarly for illustrative purposes, one of the first elevated tiebar leadframe 1818 and one of the second elevated tiebar leadframe 1838 are shown although it is understood that any number including zero of the first elevated tiebar leadframe 1818 and the second elevated tiebar leadframe 1838 may be used.

Figure 19:
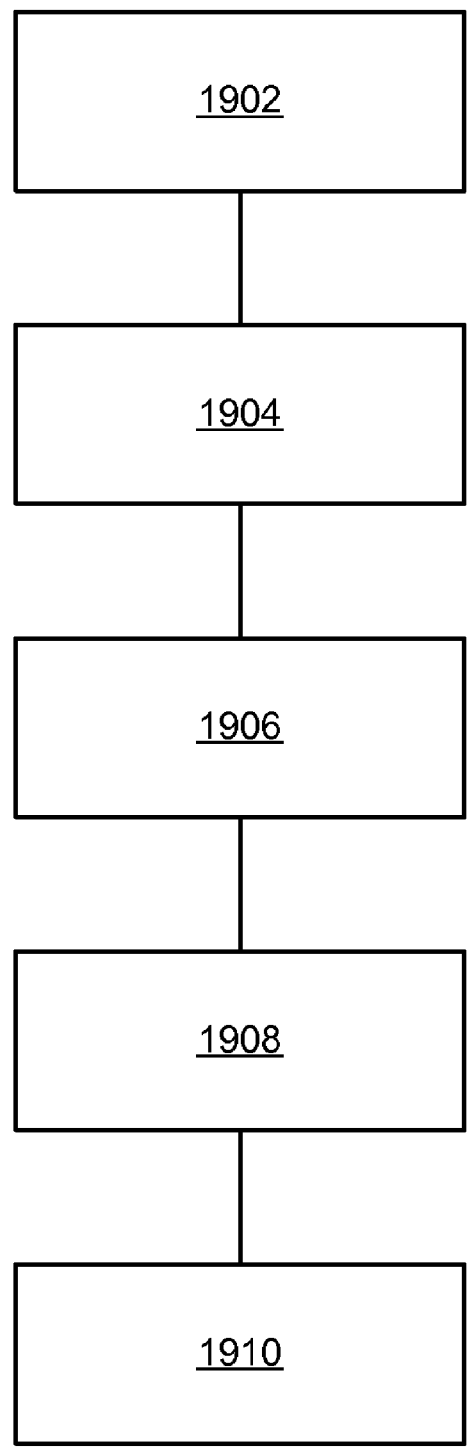
FIG. 19 is a flow chart of an integrated circuit package system for manufacturing the integrated circuit package system in an embodiment of the present invention.

Referring now to FIG. 19, therein is shown a flow chart of an integrated circuit package system 1900 for manufacturing the integrated circuit package system 100 in an embodiment of the present invention. The system 1900 includes providing an elevated tiebar in a block 1902; forming a die paddle connected to the elevated tiebar in a block 1904; attaching an integrated circuit die over the die paddle adjacent the elevated tiebar in a block 1906; attaching a shield over the elevated tiebar and the integrated circuit die in a block 1908; and forming an encapsulant over a portion of the elevated tiebar, the die paddle, and the integrated circuit die in a block 1910.

In greater detail, a system to provide the method and apparatus of the integrated circuit package system 100, in an embodiment of the present invention, is performed as follows:

1. Providing an elevated tiebar.
2. Forming a die paddle connected to the elevated tiebar.
3. Forming package connectors adjacent the die paddle and the elevated tiebar.
4. Attaching an integrated circuit die over the die paddle adjacent the elevated tiebar.
5. Attaching interconnects to the integrated circuit die, the package connectors, or the die paddle.
6. Attaching a shield over the elevated tiebar and the integrated circuit die.
7. Forming an encapsulant over a portion of the elevated tiebar, the die paddle, and the integrated circuit die.

Thus, it has been discovered that the integrated circuit package system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   providing an elevated tiebar;
   forming a die paddle connected to the elevated tiebar;
   attaching an integrated circuit die over the die paddle adjacent the elevated tiebar;
   attaching a shield over the elevated tiebar and the integrated circuit die;
   forming a shield opening for a portion of the elevated tiebar;
   applying a shield mount layer over the integrated circuit die and the shield; and
   forming an encapsulant over a portion of the elevated tiebar, the die paddle, and the integrated circuit die.

2. The system as claimed in claim 1 wherein attaching the shield includes forming a tiebar attach material in a shield opening having predetermined dimensions for an interference fit with a portion of the elevated tiebar.

3. The system as claimed in claim 1 wherein attaching the shield includes forming the shield having a shield opening with predetermined dimensions for an interference fit over a portion of the elevated tiebar.

4. The system as claimed in claim 1 wherein attaching the shield includes forming the shield having a shield cavity with predetermined dimensions for an interference fit over a portion of the elevated tiebar.

5. An integrated circuit package system comprising:
providing an elevated tiebar;
forming a die paddle connected to the elevated tiebar;
forming package connectors adjacent the die paddle and the elevated tiebar;
attaching an integrated circuit die over the die paddle adjacent the elevated tiebar;
attaching interconnects to the integrated circuit die, the package connectors, or the die paddle;
applying a tiebar attach layer to the elevated tiebar;
attaching a shield to the tiebar attach layer over the elevated tiebar and the integrated circuit die; and
forming an encapsulant over a portion of the elevated tiebar, the die paddle, and the integrated circuit die.

6. The system as claimed in claim 5 wherein attaching the shield includes applying a shield mount layer to the integrated circuit die and the shield.

7. The system as claimed in claim 5 further comprising applying a singulation process wherein the encapsulant includes a package side substantially orthogonal.

8. The system as claimed in claim 5 further comprising applying a punch process wherein a shield connector bar is near a package side.

9. An integrated circuit package system comprising:
an elevated tiebar;
a die paddle connected to the elevated tiebar;
an integrated circuit die over the die paddle adjacent the elevated tiebar;
a shield opening for a portion of the elevated tiebar;
a shield mount layer over the integrated circuit die and the shield;
a shield over the elevated tiebar and the integrated circuit die; and
an encapsulant over a portion of the elevated tiebar, the die paddle, and the integrated circuit die.

10. The system as claimed in claim 9 further comprising a tiebar attach material in a shield opening having predetermined dimensions for an interference fit with a portion of the elevated tiebar.

11. The system as claimed in claim 9 wherein the shield includes a shield opening with predetermined dimensions for an interference fit over a portion of the elevated tiebar.

12. The system as claimed in claim 9 wherein the shield includes a shield cavity with predetermined dimensions for an interference fit over a portion of the elevated tiebar.

13. The system as claimed in claim 9 wherein:
the shield is over the elevated tiebar and the integrated circuit die;
the encapsulant is over the portion of the elevated tiebar, the die paddle, and the integrated circuit die;
further comprising:
package connectors are adjacent the die paddle and the elevated tiebar; and
interconnects are attached to the integrated circuit die, the package connectors, or the die paddle.

14. The system as claimed in claim 13 further comprising a tiebar attach layer applied to the elevated tiebar and the shield.

15. The system as claimed in claim 13 further comprising a shield mount layer applied to the integrated circuit die and the shield.

16. The system as claimed in claim 13 wherein the encapsulant includes a package side substantially orthogonal from a singulation process.

17. The system as claimed in claim 13 further comprising a shield connector bar near a package side for a punch process.

* * * * *